(12) United States Patent
Wang

(10) Patent No.: US 6,307,479 B1
(45) Date of Patent: Oct. 23, 2001

(54) RUNNING INDICATOR FOR INTEGRATED CIRCUIT PACKAGE

(75) Inventor: Bily Wang, Hsin-Chu (TW)

(73) Assignee: Harvatek Corp., Hsin-Chu (TW)

( * ) Notice: Subject to any disclaimer, the term of this patent is extended or adjusted under 35 U.S.C. 154(b) by 0 days.

(21) Appl. No.: 09/633,772

(22) Filed: Aug. 7, 2000

(51) Int. Cl.$^7$ .................................................. G08B 21/00
(52) U.S. Cl. .......................... 340/635; 340/653; 340/664; 324/537
(58) Field of Search .................................. 340/635, 638, 340/641, 644, 653, 664; 324/500, 512, 522, 537

(56) References Cited

U.S. PATENT DOCUMENTS 5,757,193 * 5/1998 Yu et al. ............................... 324/501

* cited by examiner

Primary Examiner—Edward Lefkowitz
(74) Attorney, Agent, or Firm—H. C. Lin, Patent Agent

(57) ABSTRACT

A light emitting diode (LED) is connected in series with the power supply input pad of an integrated circuit chip. The LED lights up when the power supply is turned on as an indicator that the IC is operating properly.

5 Claims, 7 Drawing Sheets

RUNNING INDICATOR FOR INTEGRATED CIRCUIT PACKAGE

BACKGROUND OF THE INVENTION

(1) Field of Invention

This invention relates to integrated circuit package.

(2) Description of the Related Art

Traditional integrated circuit package do not have indicators to visually indicate whether the integrated circuit (IC) is malfunction or not. When the IC does not functional, an inspector is unable to spot a bad unit.

SUMMARY OF THE INVENTION

An object of this invention is to provide a visual indicator to show whether an IC is operational or not.

The object is obtained by connecting a light emitting diode in series with the input terminal from the power supply. A window is opened in the IC package for the inspector to see whether the IC is functional or not.

DETAILED DESCRIPTION OF THE INVENTION

Figure 1A:
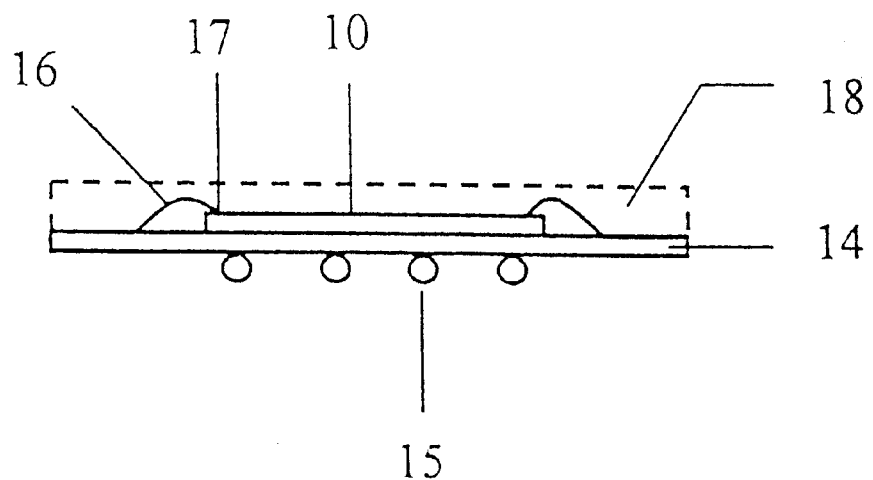
FIG. 1A shows the cross section of a prior art IC ball grid array (BGA) package

FIG. 1A shows the cross section view of a conventional BGA package for IC. An IC chip 10 is mounted on an insulating substrate 14. The bonding pads 17 of the IC chip 10 are wire bonded, fed through the substrate 14, and connected to an array of solder balls 15 at the bottom of the substrate 14. The package is sealed over the top of the substrate 14 with glue 18. Such a package has no indicator whether the packaged IC is functional or not.

Figure 1B:
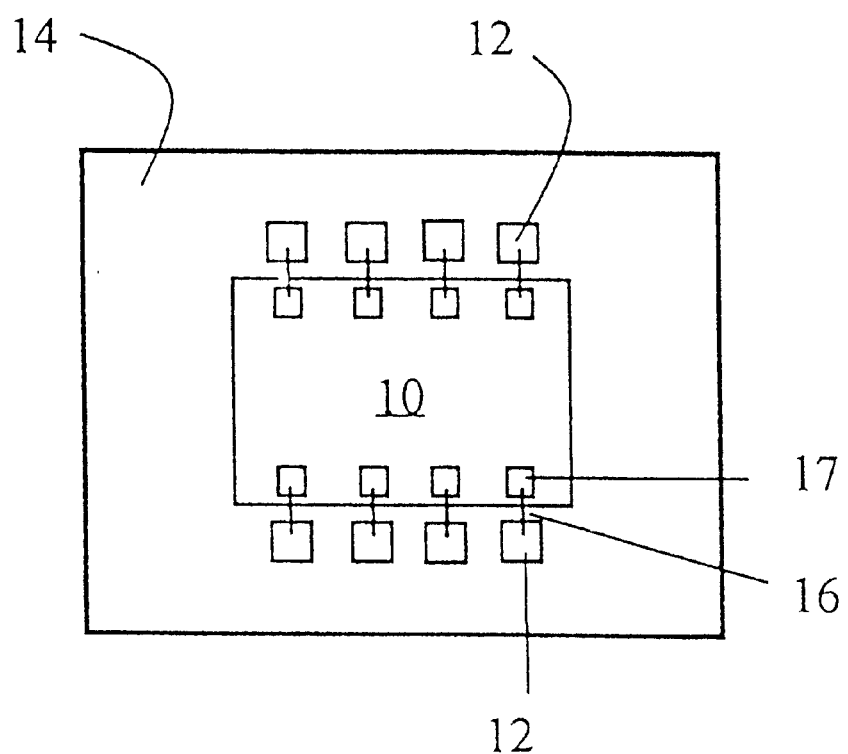
FIG. 1B shows the top view of the package shown in FIG. 1.

FIG. 1B shows the top view of the package shown in FIG. 1. The bonding pads 17 of the IC chip 10 are wire bonded through wires 16 to feed through vias 12 to reach the bottom of the substrate 14 of the BGA package.

Figure 2A:
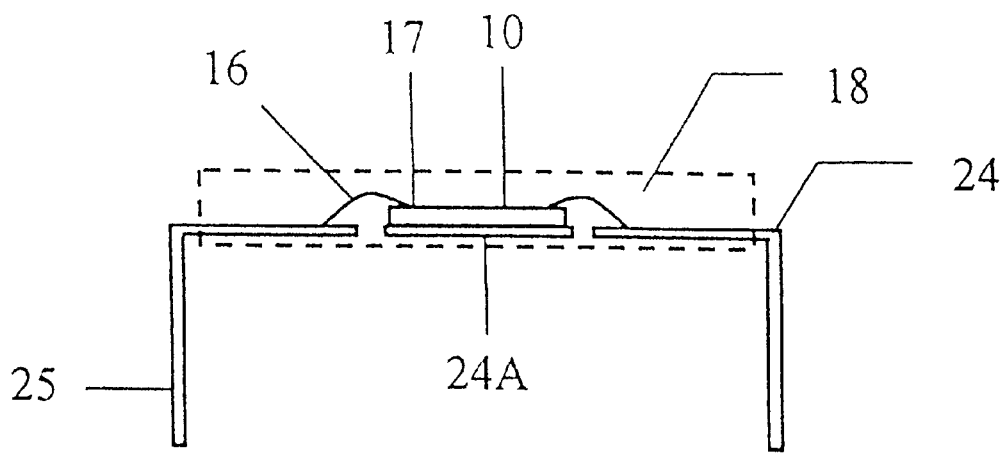
FIG. 2A shows the cross-section view of a prior-art dual in-line (DIL) IC package.

FIG. 2A shows the cross section of a dual in-line IC package. The IC chip 10 is mounted on a metal substrate 24A as a heat sink. The bonding pads 17 of the IC chip 10 are wire bonded with wires 16 to a wiring frame 24, which has extended bent leads 25 for external connections. The IC chip 10, the substrate 24A and the wiring frame 24 are sealed in glue 18.

Figure 2B:
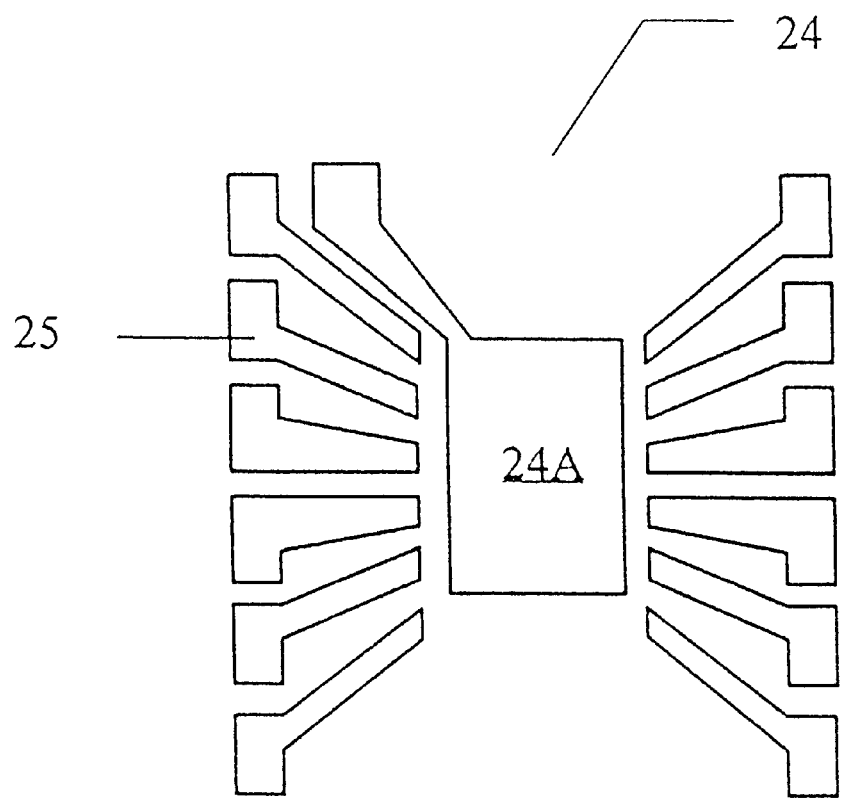
FIG. 2B shows the top view of the package shown in FIG. 2A.

FIG. 2B shows the top view of the wiring frame 24 of the package shown in FIG. 2A.

Figure 3A:
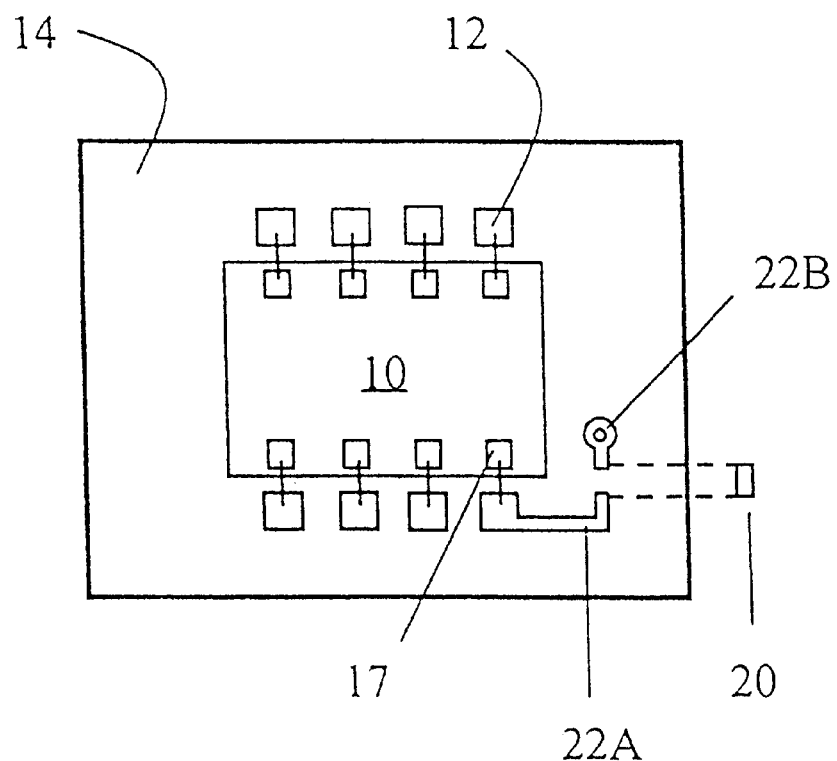
FIG. 3A shows the top view of a BGA package based on the present invention.

FIG. 3A shows the top view of a BGA package based on the present invention. The IC chip 10 is mounted on a substrate 14 as in FIG. 1B. However, the bonding pad 17 for connecting to a power supply is fed through a link 22A and a light emitting diode 20 before connecting to the top 22B of a to reach the bottom of the substrate of the BGA package. When the power supply is turned on, current passes through the LED 20 to emit light, provided the IC chip is functional. If the IC chip is not functional, current does not flow through the LED 20 and the LED 20 does not emit light.

Figure 3B:
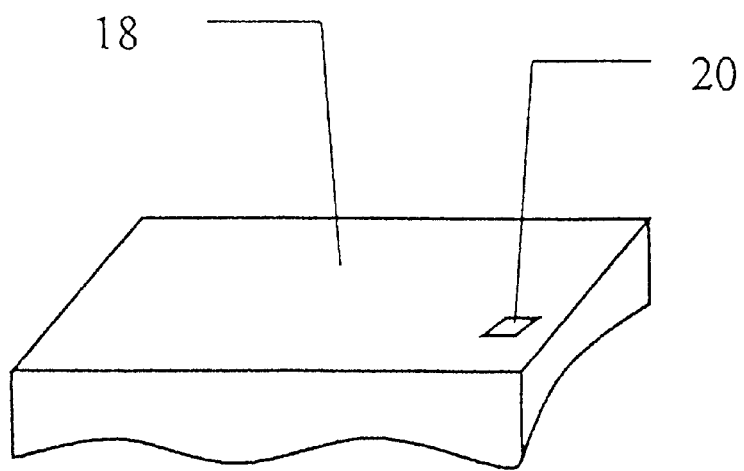
FIG. 3B shows the cover for the package based on the present invention.

FIG. 3B shows a cover 18 for the IC package. The cover 18 is opaque except at a window 20W over the LED 20 shown in FIG.3A. When the LED 20 is lighted up, the emitted light can be seen through the window 20W to indicate that the IC chip is functional.

Figure 4A:
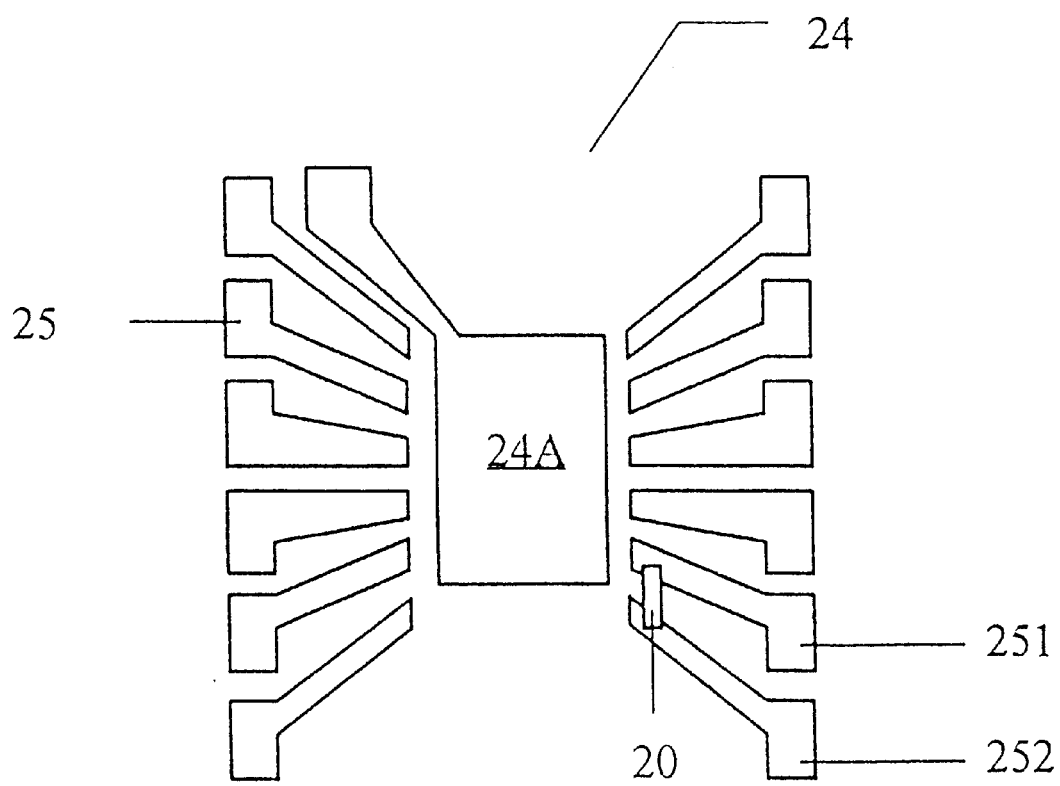
FIG. 4A shows top view of a DIL package based on the present invention.
Figure 4B:
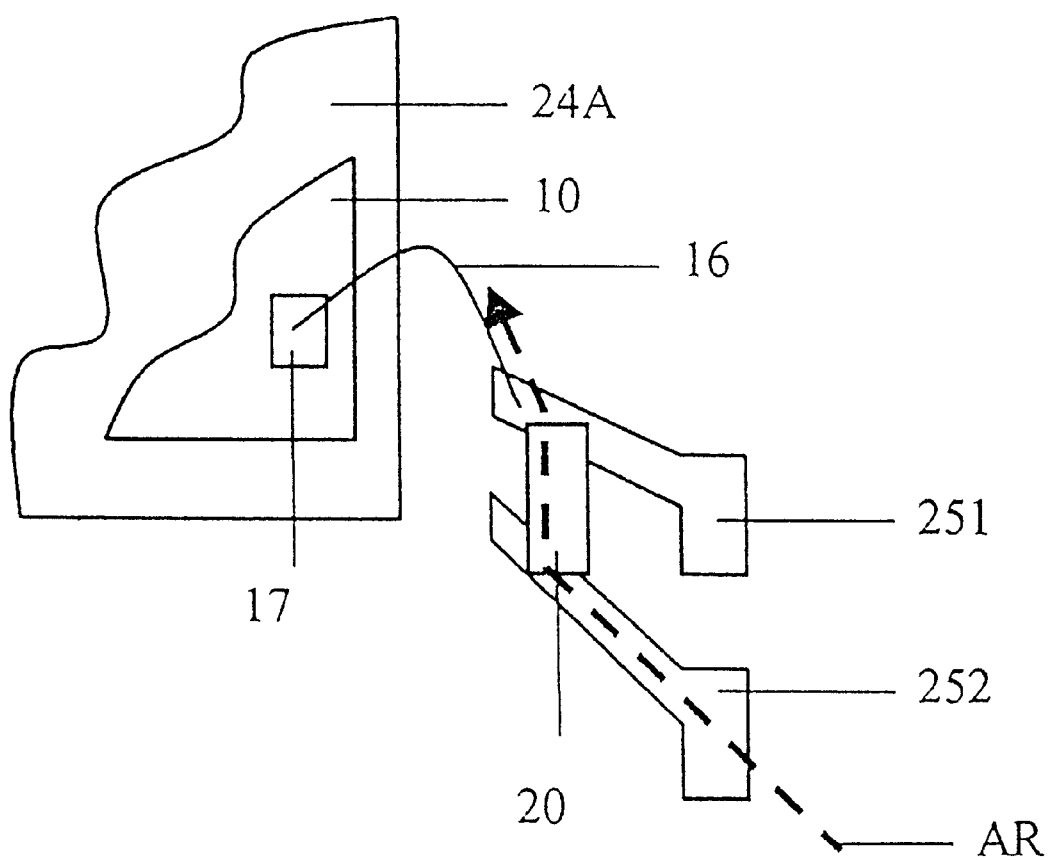
FIG. 4B shows one embodiment of connecting a light indicator for a DIL package.

FIG. 4A shows the top view of a DIL package based on the present invention. The wiring frame 24 is similar to that shown in FIG. 2B except for the inserting of a LED 20. The LED 20 bridges across two metal leads 251 and 252. The lead 251 is wire bonded to the power supply input pad of the IC chip 10 as shown in FIG. 4B and has no external connection. The lead 252 is connected to the external power supply. When the power is turned on, current passes from lead 252 through the LED 20 to the bonding pad 17 of the IC chip 10 as shown by the dashed arrow AR, and lights up the LED, provided the IC functions properly. If the IC chip 10 does not function, the LED 20 does not light up, and the inspector knows that it is a bad chip.

Figure 5A:
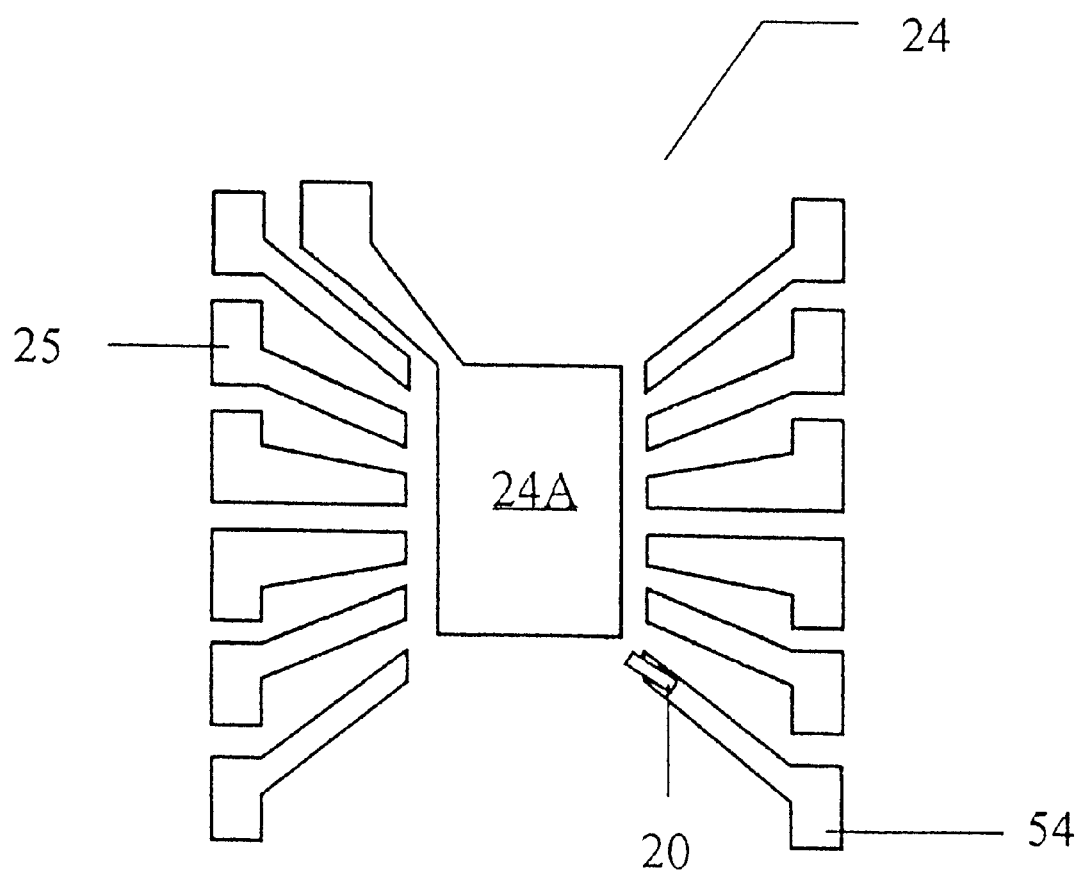
FIG. 5A shows a second embodiment of connecting a light indicator for a DIL package.
Figure 5B:
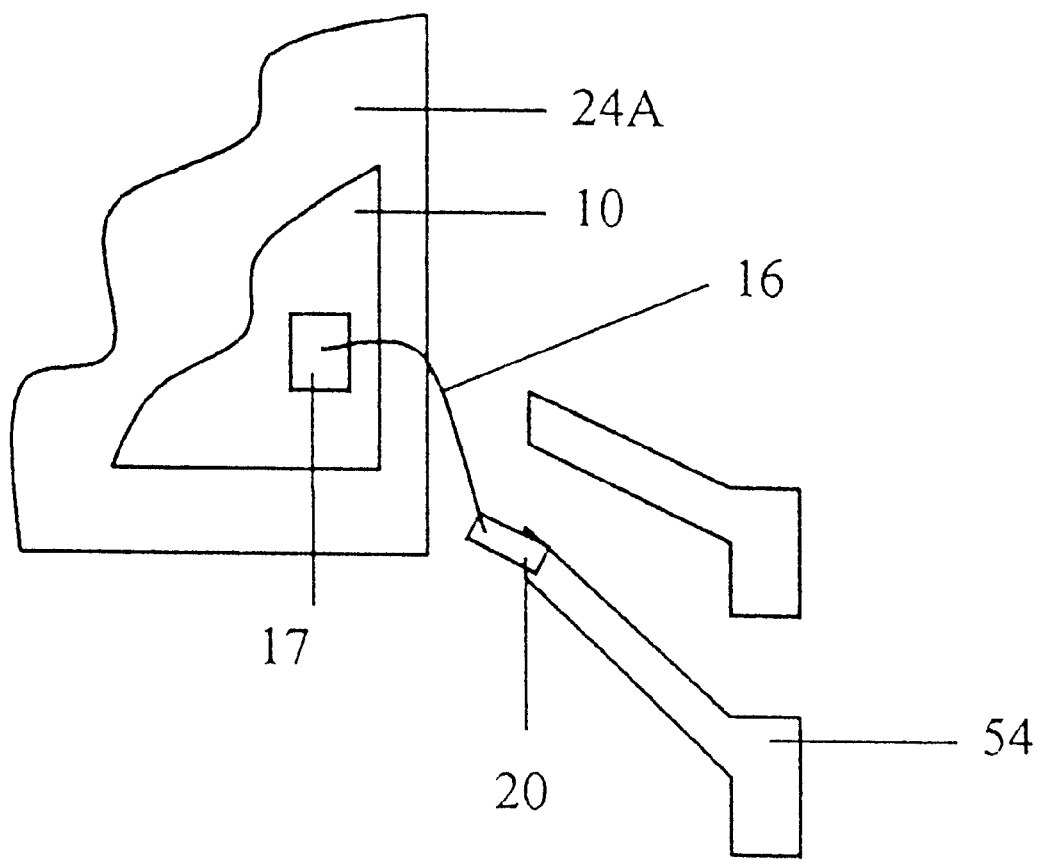
FIG. 5B shows a detailed connection of the light indicator shown in FIG. 5A

FIG. 5A shows another embodiment of the invention for the DIL package. One end of the LED is mounted on a lead 54. The other end of the LED 20 is directly wire bonded through wire 16 to a bonding pad 17 of the IC chip 10, which is mounted on the substrate 24A as shown in FIG. 5B. Comparing with FIG. 4A, this embodiment uses one less lead.

While the foregoing description refers to the connection of a LED in the path of a power supply terminal such as the positive terminal of a battery, it should be pointed that the LED can also be connected in the return path of a power supply such as the negative terminal of the battery.

While particular embodiments of the invention have been described, it will be apparent to those skilled in the art that various modifications may be made without departing from the spirit of the present invention. Such modifications are all within the scope of this invention.

What is claimed is:

1. A package for integrated circuit (IC), comprising
   an IC chip;
   a substrate for mounting said IC chip;
   a power input pad on said IC chip for inputting a source of power supply;
   an external lead for connection to said power supply,
   a light emitting diode LED integral with said IC chip, inserted between said external lead and said power input pad, and lighting up from inside said package when current passes through said LED for indicating said IC chip is functioning properly;
   a cover for said package over said IC and said substrate; and
   a window in said cover for viewing the light emitted from said LED.

2. The package as described in claim 1, wherein said package is a ball grid array package having bonding pads of said IC chip connected to tops of corresponding via holes to reach the bottom of said substrate for external connection, said LED being connected between said power input pad and one of said tops.

3. The package as described in claim 1, wherein said package is a dual inline package with metal leads for external connection, said LED having one electrode connected to one of said metal leads and second electrode connected to said power input pad.

4. The package as described in claim 3, further comprising a connection of said second electrode to a second lead of said metal leads.

5. The package as described in claim 4, wherein said second electrode is connected to said second lead by wire bonding.

* * * * *